United States Patent [19]

Su et al.

[11] Patent Number: 5,208,472
[45] Date of Patent: May 4, 1993

[54] DOUBLE SPACER SALICIDE MOS DEVICE AND METHOD

[75] Inventors: Wen-Doe Su, Yun Lin; Neng-Wei Wu, Taipei, both of Taiwan

[73] Assignee: Industrial Technology Research Institute, Taiwan

[21] Appl. No.: 893,605

[22] Filed: Jun. 3, 1992

Related U.S. Application Data

[63] Continuation of Ser. No. 651,048, Feb. 4, 1991, abandoned, which is a continuation of Ser. No. 393,662, Aug. 14, 1989, abandoned, which is a continuation of Ser. No. 194,649, May 13, 1988, abandoned.

[51] Int. Cl.$^5$ .................... H01L 29/10; H01L 29/78; H01L 23/48
[52] U.S. Cl. ................................ 257/344; 257/346; 257/408; 257/900
[58] Field of Search .............. 357/715, 675, 23.4, 357/23.3, 23.9

[56] References Cited

U.S. PATENT DOCUMENTS

| | | | |
|---|---|---|---|
| 4,259,680 | 3/1981 | Lepselter et al. | 357/675 |
| 4,356,623 | 11/1982 | Hunter | 437/200 |
| 4,384,301 | 5/1983 | Tasch, Jr. et al. | 437/200 |
| 4,486,943 | 12/1984 | Ryden et al. | 437/29 |
| 4,722,910 | 2/1988 | Yasaitis | 437/203 |
| 4,735,680 | 4/1988 | Yen | 357/675 |
| 4,743,564 | 5/1988 | Sato et al. | 437/24 |
| 4,769,686 | 9/1988 | Horiuchi et al. | 357/715 |
| 4,808,548 | 2/1989 | Thomas et al. | 437/57 |
| 4,855,798 | 8/1989 | Imamura et al. | 357/715 |
| 4,907,048 | 3/1990 | Huang | 357/715 |
| 4,912,061 | 3/1990 | Nasr | 437/44 |
| 4,949,136 | 8/1990 | Jain | 357/23.3 |

FOREIGN PATENT DOCUMENTS

| | | | |
|---|---|---|---|
| 0214542 | 9/1986 | Japan | 437/200 |
| 8605321 | 9/1986 | World Int. Prop. O. | 437/200 |

OTHER PUBLICATIONS

Muller et al, "Device Electronics for Integrated Circuits", 1986, pp. 446 and 456.
Stanley Wolf Ph.D et al., Silicon Processing for The VLSI Era, vol. 1, Process Technology, Chapter 8, "Diffusion in Silicon", Lattice Press, pp. 242-279, Jun. 1987.

*Primary Examiner*—Andrew J. James
*Assistant Examiner*—Hgan Van Ngo
*Attorney, Agent, or Firm*—Darby & Darby

[57] ABSTRACT

A method of forming a self-aligned metal oxide semiconductor (MOS) structure is described. Multilayer dielectrics are used at the edge of the gate electrode, and the gate electrode, the source and the drain have metal silicide regions. The first layer of dielectric is used to define a lightly doped drain (LDD) structure and the second dielectric layer serves to extend the oxide region at the gate edge and to improve the source/drain junction leakage property and to reduce the shorting percentage of gate to source/drain. A special device structure with extended lateral diffusion of junction under the oxide at the gate edge will be performed by using this method.

1 Claim, 2 Drawing Sheets

DOUBLE SPACER SALICIDE MOS DEVICE AND METHOD

This is a continuation of application Ser. No. 651,048 filed on Feb. 4, 1991, now abandoned, which is a continuation of application Ser. No. 393,662 filed on Aug. 14, 1989, now abandoned, which is a continuation of application Ser. No. 194,649 filed on May 13, 1988, now abandoned.

BACKGROUND OF THE INVENTION

This invention relates to techniques for forming self-aligned semiconductor devices and components for monolithographic integrated circuits. More particularly, the invention relates to a method of forming a self-aligned metal oxide semiconductor field effect transistor (MOSFET) having low junction leakage and a low percentage of shorting between the gate and the source/drain regions. The method uses two layers of dielectric film on the edge of the gate. The first layer forms a sidewall oxide used in making the lightly doped drain (LDD) structure. The second layer functions as an extended spacer to isolate the subsequently formed silicided regions from the highly doped regions. This technique forms a novel double spacer self-aligned silicide MOS structure (DSS MOS) useful for high density very large scale integrated (VLSI) circuit technology.

Self-aligned techniques have been the preferred technology for forming integrated circuits and their constituent devices and elements because of their simplicity and their ability to form high density integrated circuit (IC) devices. William D. Ryden et al., U.S. Pat. No. 4,486,943, proposed a method of fabricating a MOS transistor having a gate electrode and self-aligned source/drain region with zero overlap. A relatively thick oxide layer is thermally grown on the top and sides of a polycrystalline silicon gate. During the implantation, the thick layers act as masks to define the source/drain regions and, after heat driving, the implanted regions are substantially aligned with the gate electrode. No extra mask layer is needed to define the self-aligned source and drain regions.

As device dimensions decrease, both vertically and laterally, many problems arise, especially those caused by the increase of sheet resistance of the interconnect lines and to the source/drain regions. The increase of resistance dramatically degrades the device performance and becomes a crucial factor in device processing. To overcome this problem, researchers have incorporated refractory metal silicides into the device fabricating process; see S. P. Murarka, "Refractory Silicides for Integrated Circuits," *J. Vac. Sci. Technol.*, 17(4) (July/August 1980), pp. 775-791.

At the gate level, refractory metal silicides have received the major attention because of their compatibility with silicon gate device processing requirements. B. L. Crowder et al., "1 um MOSFET VISI Technology: Part VII--Metal Silicide Interconnection Technology--A Future Perspective" (*IEEE Transactions on Electron Devices*, Vol. ED-26, No. 4 (April 1979), pp. 369-371) describes the combination of silicide and polycrystalline silicon (polycide) instead of conventional polycrystalline silicon for gate interconnects in VLSI device processing to decrease the sheet resistance. For the source/drain regions, J. -S. Chang et al., U.S. Pat. No. 4,478,679, proposed a self-aligning process for forming a barrier metal over the source/drain regions. Initially, a layer of oxide is deposited over the entire surface. The layer is then removed, except from the side surfaces of the upwardly protruding gate region. Thereafter, successive layers of barrier metal and organic material are deposited over the surface. The organic material is removed to expose the barrier metal in all areas, except over depressed source and drain regions; and finally, the exposed barrier metal and the remaining organic is stripped, leaving barrier metal only on the surface of the source and drain regions. Unfortunately, this method does not provide the low gate and source/drain resistance simultaneously and the use of the organic material may dramatically contaminate the barrier metal.

A. F. Tasch, Jr. et al., U.S. Pat. No. 4,384,301, disclosed a high performance submicron MOSFET device structure which shows the simultaneous silicidation of the source/drain and gate regions. The silicide source and drain regions define a channel region and are isolated from the gate by insulating layers (spacers) on the edges of the gate electrode. The spacers are formed by first growing or depositing an oxide over the structure including the gate electrode, argon-implanting the oxide to a specific depth, and etching the structure so that the oxide remains only on the edges of the gate electrode region. The etchant etches the implanted areas at a high rate than the unimplanted areas. It is claimed that the thicker oxide at the edges of the gate increases the breakdown voltage between different levels of interconnections and between the gate and the source and drain. The metal silicide regions are formed simultaneously by sputtering or evaporating metal upon the device after the source and drain are formed. The device is annealed at a high temperature to cause the metal to react with the silicon to form the silicide. After annealing, the metal not exposed to silicon is removed. This process shows the use of silicide self-aligned source/drain and gate technology.

Although U.S. Pat. No. 4,384,301 shows the advantages of self-aligning and of low resistance of gate and source/drain in MOS technology, many problems still exist because shorter spaces and shallower junctions are needed to properly scale down the devices. If the length of sidewall oxide is to be reduced, isolating the gate and source/drain regions during the silicidation process becomes extremely difficult because of the lateral diffusion of the silicon and the metal along the sidewall oxide. This will result in shorting of gate and source/drain areas. It will be understood that the limit on the length of spacer is dependent on the temperature of metal/silicon reaction and the thickness of the metal film deposited.

The problem is especially severe for MOS devices using LDD structures with the self-aligned silicidation of the gate and source/drain regions. If the spacer described in U.S. Pat. No. 4,384,301 were used, the damage induced by the ion implantation of the silicon, coupled with the high stress of the silicided gate and source/drain regions, would induce significant damage near and under the spacer. This would result in high junction leakage and low electrostatic discharge (ESD) protection in the devices and circuits utilizing such devices.

SUMMARY OF THE INVENTION

In accordance with the invention, it has been discovered that the above problems can be solved by using a unique two-part spacer construction. Prior to forming the LDD structure, the first layer of sidewall oxide is deposited on the gate edge. With the LDD formed, the spacer is extended by adding a second layer of sidewall oxide. Thereafter the gate and, source/drain regions are formed using self-aligned silicide (salicide) technology. The extension of the sidewall oxide reduces the tendency for shorting between the gate and the source/drain region; decreases the damage induced by the stress of the silicide films; and increases the distance between the silicided gate and source/drain regions. As a result, a MOS device is formed having low junction leakage, low percentages of shorting from gate to source/drain, and high ESD protection.

BRIEF DESCRIPTION OF THE INVENTION

This invention relates to a method of forming self-aligned devices having low junction leakage and a low percentage of shorting from gate to source/drain. The major feature is the use of an extended sidewall oxide with a double or multilayer dielectric to isolate the source/drain regions from the gate electrode and thereby reduce the junction leakage and improve the ESD protection.

Briefly, the process includes the following steps:

1. After the gate electrode is defined, a layer of dielectric is deposited on the device and anisotropically etched, leaving sidewall oxide at the edge of the gate. With this sidewall oxide in place, the lightly doped drain (LDD) structure is formed.

2. A second layer of dielectric is deposited over the surface of the LDD structure. This layer is anisotropically etched until the silicon on the source/drain and upper gate regions is exposed. The anisotropic etching of this film leaves a second layer of dielectric on the edge of the gate and extends the sidewall width.

3. After cleaning, a suitable layer of metal is deposited or evaporated on the whole surface of wafer and heat-treated. The metal reacts with the exposed silicon regions on the gate and source/drain areas to form the silicide. The metal deposited on the field oxide and sidewall dielectric remains unreacted with silicon and is removed by selective wet etching. The silicided regions are self-aligned with the gate electrode and a final double spacer salicide MOS structure is thus formed.

The dielectric layers used in making the spacers of the instant invention are preferably silicon dioxide or silicon nitride; such layers may be deposited or grown according to conventional techniques.

While silicides may be formed by reacting numerous metals with silicon, those preferred are platinum, titanium and molybdenum. Known methods of sputtering and evaporation may be used.

The optimum dimensions for the spacers employed in the semiconductor of the invention depend on the particular application. The length of the first spacer is dependent on the required distance between the gate and the lightly doped source and drain regions. The length of the double spacers must be sufficient to prevent shorting between the gate and the source and drain regions and is preferably equal to or greater than 80% of the length of the junction depth of the source and drain regions.

BRIEF DESCRIPTION OF THE DRAWINGS

FIG. 2 is a cross-sectional drawing through a shallow junction MOS transistor showing the first dielectric spacers and the LDD structure.

FIG. 3 shows the MOS transistor after the second dielectric layer is formed.

FIG. 4 shows the MOS transistor after the second dielectric film is anisotropically etched away to form the double spacer.

FIG. 5 shows the MOS transistor after a layer of metal is deposited.

FIG. 6 shows the final step of the process of the invention wherein, after heat treatment, the unreacted metal has been removed, leaving the silicide layers atop the gate and source/drain regions.

DETAILED DESCRIPTION OF THE INVENTION

Figure 1:
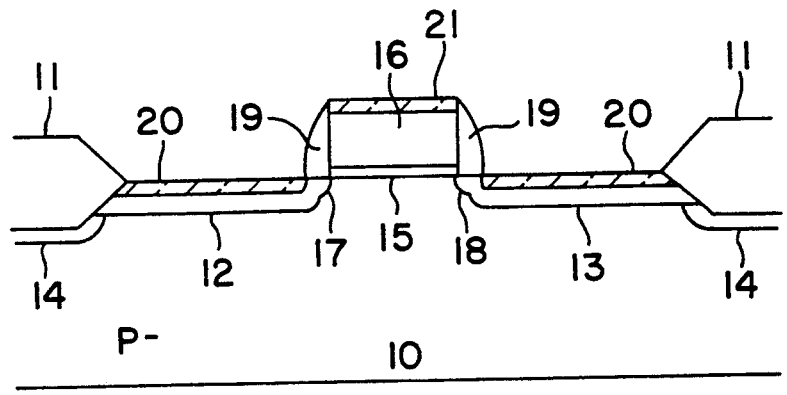
FIG. 1 is a cross-sectional drawing of a MOS transistor of the prior art showing the various elements that make up the transistor.

Before considering the present invention, reference is made to the prior art MOS structure shown in FIG. 1. A source region 12 and drain region 13 are diffused in a semiconductor material 10. The source 12 and drain 13 can be $n^+$ or $p^+$ material and the semiconductor material 10 a $p^-$ or $n^-$ material, depending upon whether the transistor is an n channel or p channel transistor, respectively. A field oxide region 11 surrounds the periphery of the source 12 and the drain 13 and electrically isolates or insulates them from the adjacent elements of the integrated circuit. For an n channel transistor, the regions $p^-$ 14 under the field oxide 11 act as the channel stop.

A thin layer of dielectric of silicon dioxide on substrate 10 forms the gate dielectric 15 of the transistor. A conductive strip 16 of polycrystalline silicon on the gate dielectric 15 forms the gate electrode 16 of the transistor. For the n channel transistor, a pair of $n^-$ source 17 and $n^-$ drain 18 regions are defined by the gate electrode 16 before forming the source 12 and drain 13 regions. A pair of insulating regions of silicon dioxide 19, referred to as spacers or sidewalls, are formed on the substrate 10 and are in contact with the edge of gate oxide 15 and the conductive polycrystalline silicon gate 16. Each insulating region 19 overlaps one of the lightly doped regions 17 and 18, and partially overlaps one of the doped regions 12 and 13. The length of n-regions 17 and 18 are controlled by the length of insulating layer 19 which, in turn, depends on the original thickness of the oxide. As claimed in U.S Pat. No. 4,384,301, the original oxide thickness is in the range of 1000–5000 Ang., and the final spacer length is in the range of 400–2000 Ang.

The metal silicide regions 20 of platinum silicide or titanium silicide lie in the source 12 and drain 13 regions with one edge being coincident with an edge of one of the insulating regions 19. A silicide region 21 lies on the surface of the polycrystalline silicon gate electrode 16. The silicide regions 20 in the source 12 and drain 13 are self-aligned with the silicide region 21 on the gate electrode 16 and are isolated therefrom by the spacer 19. Consequently, one of the features of the self-aligned silicided MOS structure with LDD characteristic of the prior art shown in FIG. 1 is that the horizontal distance between the silicide region 21 on the gate electrode 16 and silicide regions 20 on source 12 and drain 13 regions is controlled by the length of spacer 19. In addition, the length of $n^-$ regions 17 and 18 is controlled by the length of spacer 19.

FIGS. 2 through 6 show the process and device of the instant invention. The same numerals are used in these figures as in FIG. 1 to designate common elements.

Figure 2:
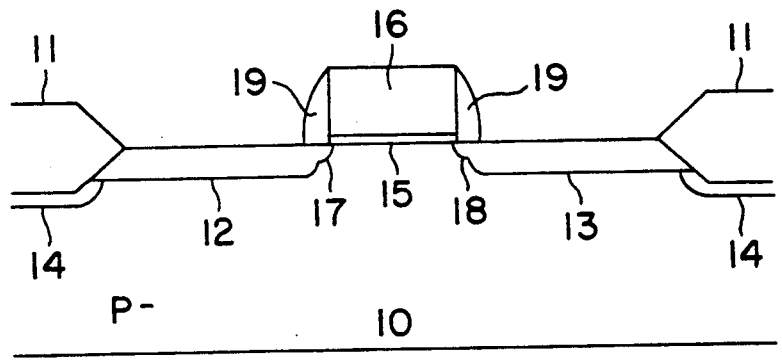
FIGS. 2 to 6 show the several steps in forming the MOS transistor of the invention.

FIG. 2 illustrates the shallow junction MOS transistor showing the LDD structure formed using the spacer as a mask. The oxide spacer 19 serves to isolate the gate electrode 16 from the source 12 and the drain 13 regions to define the LDD structure. The oxide spacer 19 is conventionally formed without a mask by first depositing or growing an oxide layer with thickness in the range of 500-3000 Ang. over the entire surface of the wafer, and then anisotropically etching the layer until only thin layers of oxide in the range of 50-300 Ang. remain on the surface of source 12, drain 13 and gate electrode 16 (not shown). The resulting spacer 19 having a thickness in the range of 300-2500 Ang. is formed on the edge of the gate. A reactive ion etching (RIE) machine with freon and oxygen plasma is used to perform the anisotropic etching of the oxide as is known in the art. The residual thin oxide on the surface of source 12 and drain 13 serves to reduce the ion implantation damages induced in the source 12 and drain 13 regions.

Figure 3:
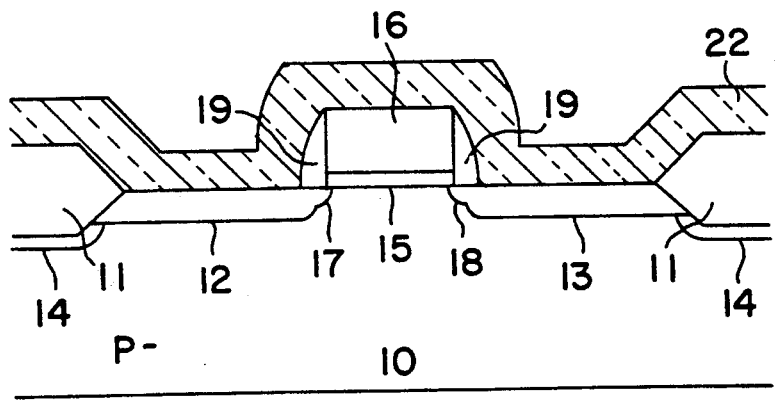
Figure 4:
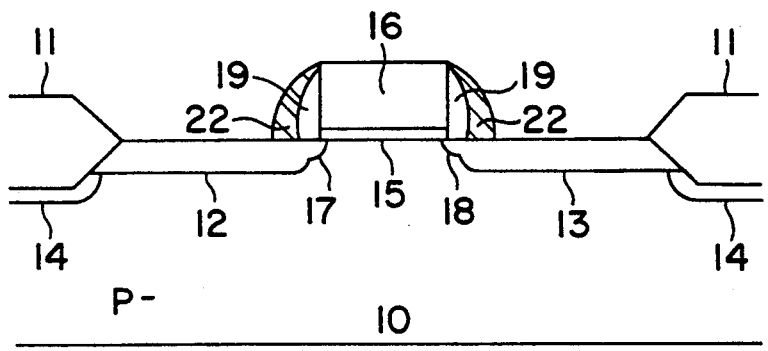

FIG. 3 is the cross-sectional drawing of the MOS transistor after the second dielectric layer 22 is added. The dielectric film 22 is deposited by low pressure chemical vapor deposition (LPCVD) or plasma enhanced chemical vapor deposition (PECVD) to a thickness in the range of 1000-5000 Ang. The dielectric film 22 is subsequently subjected to anisotropic etching by using an RIE machine, with freon and oxygen plasma, until the silicon regions in source 12 and drain 13 and gate electrode 16 areas are exposed. Only the pair of sidewall dielectric films 22, i.e., the second spacers, remain on the surface of spacer 19 as shown in FIG. 4. These have a thickness of from 500 to 4000 Ang.

Figure 5:
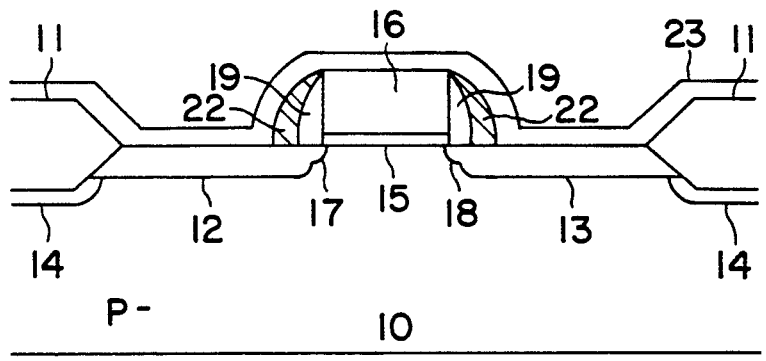

After cleaning the wafer to ensure no native oxide remains on the exposed silicon regions, a metal film 23 such as titanium is deposited by sputtering, evaporating or chemical vapor deposition (CVD) over the surface of the wafer as shown in FIG. 5 to a thickness in the range of 100-1000 Ang. Other metals, such as platinum, cobalt and tungsten, may also be used. The device is then annealed at 600-675' C., preferably 650' C., for approximately 30 minutes in $N_2$ atmosphere to form the silicide regions 24 and 25. The surface is then treated with a wet etchant ($NH_4OH:H_2O_2:H_2O = 1:1:5$) to remove the titanium nitride and unreacted titanium.

Figure 6:
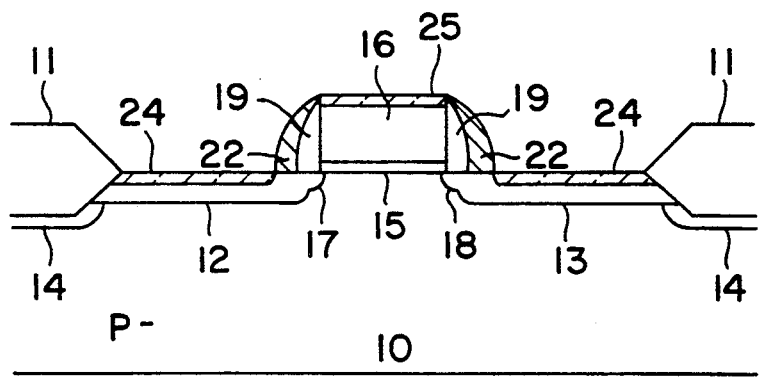

In the final structure, shown in FIG. 6, the layers 24 and 25 represent the silicide layers in the source, drain and gate regions.

In summary, it will be seen that by following the teaching of the invention, the first spacer may be used to isolate the gate electrode 16 and the source 12 and drain 13 regions to optimally define the LDD structure in the N channel MOS transistor; and the second spacer may be used to optimally define the silicide regions to avoid shorting of gate electrode to the source/drain regions. Consequently, the length of the $n^-$ regions and distance between the silicided gate electrode and source/drain regions can be controlled independently. The length of the lateral diffusion region under the two spacers may be made equal to or longer than the junction depth of source or drain, thereby avoiding junction leakage, gate to source/drain shorting and low ESD protection, problems inherent in the prior art of self-aligned silicide MOS structure where a single spacer was employed.

EXAMPLE 1

Junction Leakage Comparisons

To illustrate the reduced $p^+ n^-$ junction leakage of channel implanted structures, a comparison was made between the single and double spacer salicide semiconductor devices, the latter being prepared in accordance with the teaching of the invention. Nine diodes were tested using a HP4140B meter at a reserve voltage of −7 V. Square and finger structures were tested. The areas and perimeter of the square structure are 90000 $um^2$ and 1200 um, respectively, while those of the finger structure are 74100 $um^2$ and 10920 um, respectively. The results are reported in the following table:

TABLE 1

| | Single Spacer Silicide $P^+N^-$ Channel | | Double Spacer Silicide $P^+N^-$ Channel | |
|---|---|---|---|---|
| No. | Square | Finger | Square | Finger |
| 1 | 2E-10 | 3.5E-10 | 3.1E-12 | 2.8E-11 |
| 2 | 2.9E-12 | 7.9E-04 | 4.3E-12 | 2.7E-11 |
| 3 | 2.2E-10 | 1.0E-03 | 2.8E-12 | 1.8E-11 |
| 4 | 2.6E-11 | 4.8E-11 | 2.8E-12 | 2.0E-11 |
| 5 | 2.7E-07 | 3.2E-07 | 3.1E-12 | 3.0E-11 |
| 6 | 6.9E-09 | 3.7E-07 | 4.1E-12 | 1.8E-10 |
| 7 | 7.0E-11 | 9.8E-10 | 3.6E-12 | 2.1E-11 |
| 8 | 1.4E-08 | 2.6E-08 | 4.3E-12 | 2.2E-11 |
| 9 | 3.8E-07 | 1.9E-06 | 3.9E-12 | 2.1E-11 |

The above data show that in each and every case the junction leakage was considerably reduced by using the double spacer silicide structure and process of the invention. This is of particular importance in dense packed semiconductor devices.

EXAMPLE 2

Bridging Comparisons

To show the reduced percentage of bridging, single spacer and double spacer structures were compared using a HP4062 meter to measure the voltage between two silicided polysilicon lines at a current of 1 uA. The thickness of the first spacers and the second spacers, the period of implant, and the thickness of the titanium silicide layers are set forth. The structure is considered "bridging" if the voltage is less than 10 volts. The results are reported in the following table:

TABLE 2

| No. | Spacer 1 | N+ | Spacer 2 | P+ | Ti | Bridging |
|---|---|---|---|---|---|---|
| 1 | 3500A | 120 min. | 0A | 45 min. | 300A | 36.7% |
| 2 | 3500A | 120 min. | 3500A | 45 min. | 300A | 3.3% |
| 3 | 3500A | 120 min. | 0A | 45 min. | 500A | 60% |
| 4 | 3500A | 120 min. | 3500A | 45 min. | 500A | 0% |
| 5 | 2000A | 60 min. | 0A | 25 min. | 500A | 90% |
| 6 | 2000A | 60 min. | 3500A | 25 min. | 500A | 3.3% |
| 7 | 1500A | 30 min. | 0A | 15 min. | 300A | 100% |
| 8 | 1500A | 30 min. | 3500A | 15 min. | 300A | 0% |
| 9 | 1500A | 30 min. | 0A | 15 min. | 500A | 93.3% |
| 10 | 1500A | 30 min. | 3500A | 15 min. | 500A | 60% |
| 11 | 1500A | 30 min. | 0A | 15 min. | 700A | 100% |
| 12 | 1500A | 30 min. | 3500A | 15 min. | 700A | 83.3% |

The above data clearly show that the percent bridging is markedly reduced when using the double spacer salicide process of the instant invention. These results are particularly outstanding and facilitate the formation of densely packed semiconductor devices.

What is claimed is:

1. A self-aligned MOS semiconductor device comprising:

a substrate;

a gate insulating layer having opposing vertical edges disposed upon said substrate;

a gate region of predetermined height disposed upon said gate insulating layer, said gate region being of substantially constant longitudinal cross-section throughout said height, and said cross-section having opposed vertical edges disposed upon and vertically aligned with the vertical edges of the gate insulating layer so as to form continuous vertical sidewalls;

a lightly doped source region and a lightly doped drain region embedded in said substrate, each substantially aligned with and outwardly disposed from one of said vertical sidewalls;

opposed dielectric first spacer means each contiguous with and outwardly disposed by a first distance of between 300 and 2500 Å from one of the vertical sidewalls along the upper surface of the lightly doped source and drain regions, respectively;

a source region and a drain region embedded a predetermined junction depth in said substrate contiguous with and outwardly disposed from said lightly doped source and drain regions respectively and forming vertical boundaries therewith, each of said boundaries being substantially aligned with the outer edge of one of said first spacer means;

opposed dielectric second spacer means each contiguous with and outwardly disposed by a second distance of between 500 and 4000 Å from the outer edge of one of said first spacer means along the upper surface of the source and drain regions, respectively;

a first silicide region embedded in the upper face of said gate region; and second and third silicide regions embedded in and forming vertical boundaries with said source and drain regions, respectively, each of said boundaries being substantially aligned with the outer edge of one of said second spacer means;

the sum of said first and second distances being at least 80% of said junction depth and being optimally defined to maximize electrostatic discharge protection between the gate region and the silicide in the source and drain regions; and the first distance being optimally defined to minimize junction leakage while maintaining device performance.

* * * * *

UNITED STATES PATENT AND TRADEMARK OFFICE
CERTIFICATE OF CORRECTION

PATENT NO. : 5,208,472

DATED : May 4, 1993

INVENTOR(S) : Wen-Doe Su
Neng-Wei Wu

It is certified that error appears in the above-identified patent and that said Letters Patent is hereby corrected as shown below:

Page 1 of 2

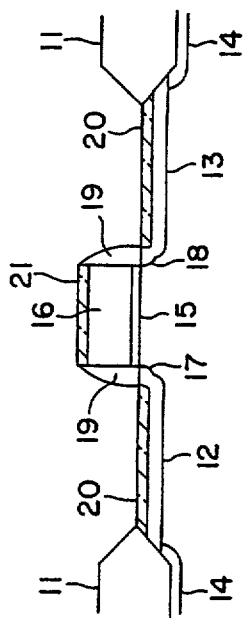

FIG. 1 PRIOR ART

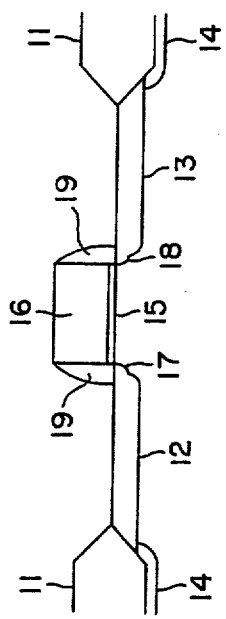

FIG. 2

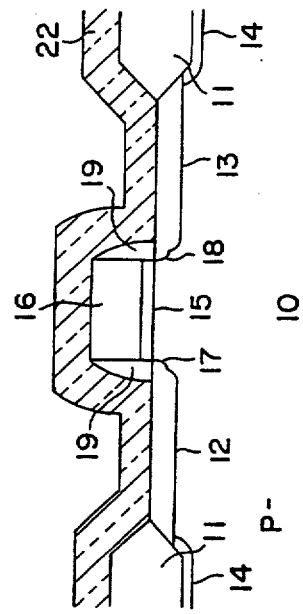

FIG. 3

UNITED STATES PATENT AND TRADEMARK OFFICE
CERTIFICATE OF CORRECTION

PATENT NO. : 5,208,472

DATED : May 4, 1993

INVENTOR(S) : Wen-Doe Su
Neng-Wei Wu

It is certified that error appears in the above-identified patent and that said Letters Patent is hereby corrected as shown below:

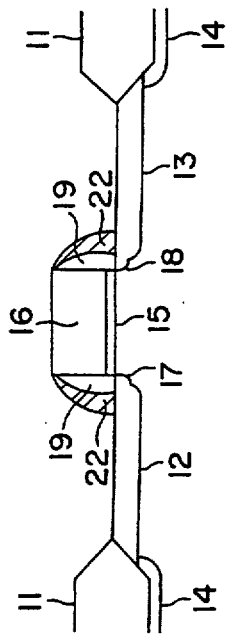 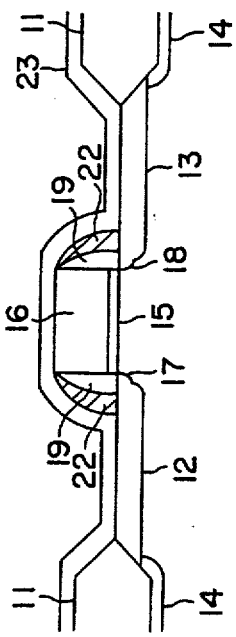

Signed and Sealed this

First Day of November, 1994

Attest:

Attesting Officer

BRUCE LEHMAN

Commissioner of Patents and Trademarks